(12) United States Patent
Wieting et al.

(10) Patent No.: US 8,372,684 B1
(45) Date of Patent: Feb. 12, 2013

(54) METHOD AND SYSTEM FOR SELENIZATION IN FABRICATING CIGS/CIS SOLAR CELLS

(75) Inventors: Robert D. Wieting, Simi Valley, CA (US); Steven Aragon, Campbell, CA (US); Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/776,189

(22) Filed: May 7, 2010

Related U.S. Application Data

(60) Provisional application No. 61/178,459, filed on May 14, 2009.

(51) Int. Cl.
*H01L 21/00* (2006.01)

(52) U.S. Cl. .......... 438/94; 438/84; 438/93; 438/95; 438/98; 438/102; 136/258; 136/260; 136/262; 136/264; 136/265; 257/613; 257/E21.068; 257/E31.007; 257/E31.008; 257/E29.087; 219/390; 427/255.29; 427/255.32; 427/255.33; 427/255.34

(58) Field of Classification Search .............. None
See application file for complete search history.

(56) References Cited

U.S. PATENT DOCUMENTS

| | | | |
|---|---|---|---|
| 4,204,933 A | 5/1980 | Barlow et al. | |
| 4,213,781 A | 7/1980 | Noreika et al. | |
| 4,239,553 A | 12/1980 | Barnett et al. | |
| 4,347,436 A | 8/1982 | Fukuda et al. | |
| 4,502,225 A | 3/1985 | Lin | |
| 4,611,091 A * | 9/1986 | Choudary et al. | 136/260 |
| 4,612,411 A | 9/1986 | Wieting et al. | |
| 4,705,912 A | 11/1987 | Nakashima et al. | |
| 4,873,118 A | 10/1989 | Elias et al. | |
| 4,915,745 A | 4/1990 | Pollock et al. | |
| 4,996,108 A | 2/1991 | Divigalpitiya et al. | |
| 5,125,984 A | 6/1992 | Kruehler et al. | |
| 5,261,968 A | 11/1993 | Jordan | |
| 5,399,504 A | 3/1995 | Ohsawa | |
| 5,421,909 A | 6/1995 | Ishikawa et al. | |
| 5,482,571 A | 1/1996 | Yamada et al. | |
| 5,501,744 A | 3/1996 | Albright et al. | |
| 5,536,333 A | 7/1996 | Foote et al. | |
| 5,578,103 A | 11/1996 | Araujo et al. | |
| 5,589,006 A | 12/1996 | Itoyama et al. | |
| 5,622,634 A | 4/1997 | Noma et al. | |
| 5,626,688 A | 5/1997 | Probst et al. | |
| 5,665,175 A | 9/1997 | Safir | |
| 5,855,974 A | 1/1999 | Wu et al. | |

(Continued)

OTHER PUBLICATIONS

Palm et al. "Second generation CIS solar modules" Solar Energy 77 (2004) 757-765.*

(Continued)

*Primary Examiner* — Julio J Maldonado
*Assistant Examiner* — Shantanu C Pathak
(74) *Attorney, Agent, or Firm* — Kilpatrick Townsend & Stockton LLP

(57) ABSTRACT

The method and system for selenization in fabricating CIS and/or CIGS based thin film solar cell overlaying cylindrical glass substrates. The method includes providing a substrate, forming an electrode layer over the substrate and depositing a precursor layer of copper, indium, and/or gallium over the electrode layer. The method also includes disposing the substrate vertically in a furnace. Then a gas including a hydrogen species, a selenium species and a carrier gas are introduced into the furnace and heated to between about 350° C. and about 450° C. to at least initiate formation of a copper indium diselenide film from the precursor layer.

23 Claims, 10 Drawing Sheets

U.S. PATENT DOCUMENTS

| | | | |
|---|---|---|---|
| 5,948,176 A | 9/1999 | Ramanathan et al. |
| 5,985,691 A | 11/1999 | Basol et al. |
| 6,001,744 A | 12/1999 | Doi |
| 6,077,722 A | 6/2000 | Jansen et al. |
| 6,134,049 A | 10/2000 | Spiller et al. |
| 6,169,246 B1 | 1/2001 | Wu et al. |
| 6,258,620 B1 | 7/2001 | Morel et al. |
| 6,288,325 B1 | 9/2001 | Jansen et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| 6,335,479 B1 | 1/2002 | Yamada et al. |
| 6,361,718 B1 | 3/2002 | Shinmo et al. |
| 6,380,480 B1 | 4/2002 | Norimatsu et al. |
| 6,423,565 B1 | 7/2002 | Barth et al. |
| 6,537,845 B1 | 3/2003 | McCandless et al. |
| 6,632,113 B1 | 10/2003 | Noma et al. |
| 6,635,307 B2 | 10/2003 | Huang et al. |
| 6,692,820 B2 | 2/2004 | Forrest et al. |
| 7,179,677 B2 | 2/2007 | Ramanathan et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,303,788 B2 | 12/2007 | Kataoka et al. |
| 7,319,190 B2 | 1/2008 | Tuttle |
| 7,364,808 B2 | 4/2008 | Sato et al. |
| 7,544,884 B2 | 6/2009 | Hollars |
| 7,576,017 B2 | 8/2009 | Tuttle |
| 7,736,755 B2 | 6/2010 | Igarashi et al. |
| 7,741,560 B2 | 6/2010 | Yonezawa |
| 7,846,750 B2 | 12/2010 | Boyer |
| 7,863,518 B2 | 1/2011 | Terakawa et al. |
| 7,875,945 B2 | 1/2011 | Krasnov et al. |
| 7,910,399 B1 | 3/2011 | Wieting |
| 8,017,860 B2 | 9/2011 | Lee |
| 8,142,521 B2 | 3/2012 | Wieting et al. |
| 8,178,370 B2 | 5/2012 | Lee et al. |
| 2002/0004302 A1 | 1/2002 | Fukumoto et al. |
| 2002/0061361 A1 | 5/2002 | Nakahara et al. |
| 2003/0188777 A1 | 10/2003 | Gaudiana et al. |
| 2004/0191949 A1 | 9/2004 | Iwata et al. |
| 2004/0191950 A1 | 9/2004 | Nakamura et al. |
| 2005/0098205 A1 | 5/2005 | Roscheisen et al. |
| 2005/0109392 A1 | 5/2005 | Hollars |
| 2005/0223570 A1 | 10/2005 | Yonezawa et al. |
| 2006/0112983 A1 | 6/2006 | Parce et al. |
| 2006/0219288 A1 | 10/2006 | Tuttle |
| 2006/0220059 A1 | 10/2006 | Satoh et al. |
| 2006/0249202 A1 | 11/2006 | Yoo et al. |
| 2007/0004078 A1* | 1/2007 | Alberts .......................... 438/95 |
| 2007/0089782 A1 | 4/2007 | Scheuten et al. |
| 2007/0116892 A1* | 5/2007 | Zwaap et al. ................ 427/587 |
| 2007/0151596 A1 | 7/2007 | Nasuno et al. |
| 2007/0169810 A1 | 7/2007 | Van Duern et al. |
| 2007/0209700 A1 | 9/2007 | Yonezawa et al. |
| 2007/0243657 A1 | 10/2007 | Basol et al. |
| 2007/0264488 A1 | 11/2007 | Lee |
| 2008/0029154 A1 | 2/2008 | Mishtein et al. |
| 2008/0041446 A1 | 2/2008 | Wu et al. |
| 2008/0092945 A1 | 4/2008 | Munteanu et al. |
| 2008/0092953 A1 | 4/2008 | Lee |
| 2008/0110491 A1 | 5/2008 | Buller et al. |
| 2008/0115827 A1 | 5/2008 | Woods et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0283389 A1 | 11/2008 | Aoki |
| 2009/0021157 A1 | 1/2009 | Kim et al. |
| 2009/0084438 A1 | 4/2009 | den Boer et al. |
| 2009/0087942 A1 | 4/2009 | Meyers |
| 2009/0145746 A1 | 6/2009 | Hollars |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0087027 A1 | 4/2010 | Wieting |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0224247 A1 | 9/2010 | Bartholomeusz et al. |
| 2010/0233386 A1 | 9/2010 | Krause et al. |
| 2010/0267189 A1 | 10/2010 | Yu et al. |
| 2010/0297798 A1 | 11/2010 | Adriani et al. |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |

OTHER PUBLICATIONS

Salvador, "Hole diffusion length in n-TiO2 single crystals and sintered electrodes: photoelectrochemical determination and comparative analysis," Journa; of Applied Physics, vol. 55, No. 8, pp. 2977-2985, Apr. 15, 1984.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

* cited by examiner

METHOD AND SYSTEM FOR SELENIZATION IN FABRICATING CIGS/CIS SOLAR CELLS

CROSS-REFERENCES TO RELATED APPLICATIONS

This application claims priority to U.S. Provisional Patent Application No. 61/178,459, filed May 14, 2009, entitled "METHOD AND SYSTEM FOR SELENIZATION IN FABRICATING CIGS/CIS SOLAR CELLS" by inventors Robert D Wieting, Steven Aragon, and Chester A Farris III., commonly assigned and incorporated by reference herein for all purposes.

BACKGROUND OF THE INVENTION

This invention relates generally to photovoltaic techniques. More particularly, embodiments of the present invention provide a method and system for selenization in fabricating a copper indium diselenide species (CIS), copper indium gallium diselenide species (CIGS) based thin film photovoltaic cell, as well as other thin film cells. The invention can be applied to cylindrical/tubular photovoltaic modules, non-planar surfaces, flexible sheets, building or window glass, roof tiles, automobiles, and other objects.

In the process of manufacturing CIS and/or CIGS types of thin films, there are various manufacturing challenges, such as maintaining structure integrity of substrate materials, ensuring uniformity and granularity of the thin film material, etc. While conventional techniques in the past have addressed some of these issues, they are often inadequate in one regard or another. Herein an improved system and method for manufacturing thin film photovoltaic devices is described.

BRIEF SUMMARY OF THE INVENTION

This invention relates generally to photovoltaic techniques. More particularly, embodiments of the present invention provide a method and system for selenization in fabricating a copper indium diselenide species (CIS), copper indium gallium diselenide species (CIGS) based thin film photovoltaic cell, as well as other thin film cells. The invention can be applied to cylindrical/tubular photovoltaic modules, non-planar surfaces, flexible sheets, building or window glass, roof tiles, automobiles, and other objects.

In one embodiment, the invention provides a method for selenization in fabricating a copper indium diselenide semiconductor film. The method includes providing a substrate having a form such as a cylinder, a sphere, a tubular, a non-planar, and a foil. The method includes forming a first electrode layer over the substrate and sputter depositing a sodium doping layer over the first electrode layer, followed by depositing a precursor layer which includes copper, indium, and/or gallium species. Additionally, the method includes disposing the substrate, including the precursor layer, into a furnace in a vertical orientation. The method further includes introducing a gaseous species including at least a selenium gas species and a carrier gas into the furnace and then heating the furnace to increase its temperature from a first temperature to a second temperature. The second temperature ranges from about 350° C. to about 450° C., and at least partially initiates a transformation of the precursor layer to a copper indium diselenide film on the substrate. Furthermore, the method includes maintaining the temperature at about the second temperature for a first period of time, removing at least the selenium species from the furnace, and introducing a sulfur species into the furnace. Following that, the temperature is increased to a third temperature ranging from about 500° C. to 525° C. while the substrate is maintained in an environment including a sulfur species, thereby extracting one or more selenium species from the copper indium diselenide film.

According to an alternative embodiment, the present invention provides an apparatus for selenization in fabricating CIGS based solar cell. The apparatus includes a vertical or a horizontal oriented annular chamber member having a length and a diameter of at least 40 centimeters. A support device is configured within the annular chamber, together with a plurality of cylindrical workpiece members. Each of the cylindrical work piece members has a surface region which includes an electrode, as well as an overlying layer which includes at least copper, indium, or gallium. Additionally, the apparatus includes a thermal energy source coupled to the annular chamber member to introduce thermal energy to the plurality of cylindrical work piece members. The apparatus also includes inlets and outlets to the annular chamber.

According to yet another alternative embodiment, the invention provides a method of two-stage formation of copper indium diselenide films for solar cells. The method includes providing a substrate member characterized by a width and a length in a spatial form selected from a desired shape such as a cylinder, a tube, a sphere, other non-planar surface, a foil, and a plastic. The substrate member includes a surface region and an electrode layer overlying the surface region. Additionally, the method includes forming a sodium doping layer overlying the electrode layer by sputtering from a sodium bearing target and forming a precursor layer overlying the sodium doping layer using physical vapor deposition of alloy materials comprising copper, indium, and/or gallium at a temperature less than 200° C. The method further includes loading the substrate member including the precursor layer into an annular chamber with the length in a vertical orientation respect to a direction of gravity. Furthermore, the method includes annealing the substrate member within the annular chamber under a condition comprising a first temperature of about 450° C. or less, a substantially constant pressure, and a gaseous environment comprising selenium gas and an inert gas. Moreover, the method includes annealing the substrate member within the annular chamber under a condition comprising a second temperature of about 525° C. or less, a substantially constant pressure, and a gaseous environment of sulfur gas but with selenium gas species being substantially removed. The annealing under the first temperature profile initiates a formation of copper-indium diselenide film from the precursor layer comprising copper, indium, and/or gallium mixed in with sodium. The sulfur species during the annealing under the second temperature profile initiates an extraction of 5 to 10% selenium from the copper-indium diselenide film.

The present invention provides benefits over conventional techniques. In particular, the systems and processes of the present invention are compatible with conventional systems, which allow cost effective implementation. In various embodiments, the temperature control method maintains structure integrity of substrates while providing allows various reactions to occur. There are other benefits as well.

DETAILED DESCRIPTION OF THE INVENTION

The present invention relates generally to photovoltaic techniques. More particularly, embodiments of the present invention provide a method and system for selenization in fabricating a copper indium diselenide species (CIS), copper indium gallium diselenide species (CIGS) based thin film photovoltaic cell, and/or others. The invention can be applied to cylindrical/tubular photovoltaic modules, non-planar surfaces, flexible sheets, building or window glass, roof tiles, automobiles, and others.

Figure 1A:
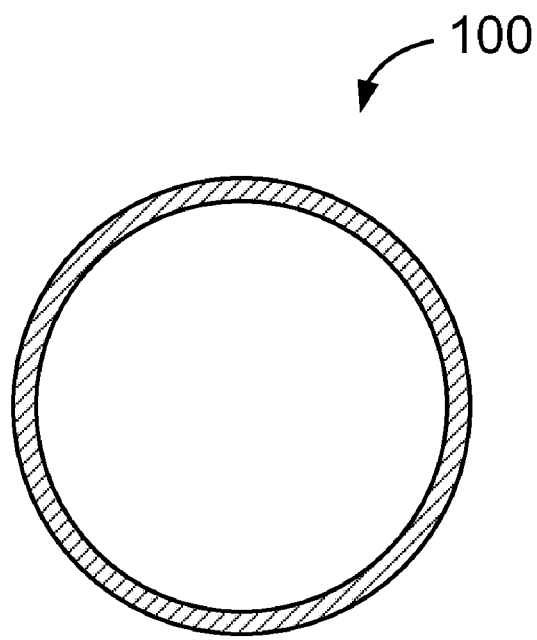
FIGS. 1A and 1B are simplified cross section views of a substrate respectively with a tubular, a cylindrical, or a spherical shape according to an embodiment of the present invention.
Figure 1B:
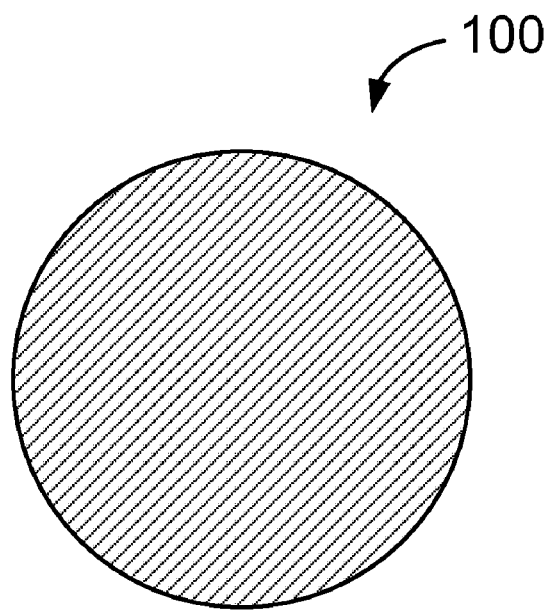
Figure 1C:
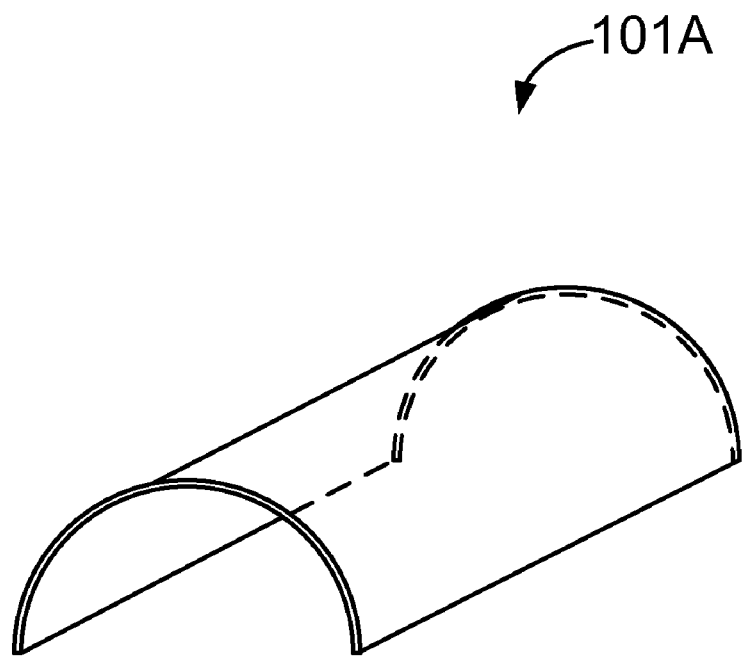
FIGS. 1C and 1D are simplified perspective views of a substrate respectively with a hemi-cylindrical and a foiled shape according to an embodiment of the present invention.
Figure 1D:
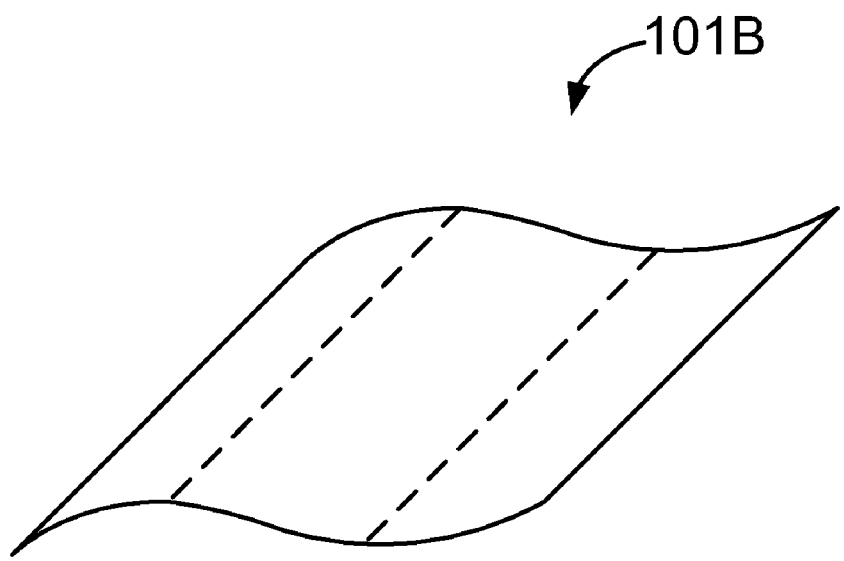

FIGS. 1A and 1B are simplified cross section views of a substrate respectively with a tubular, a cylindrical, or a spherical shape according to an embodiment of the present invention. These diagrams are merely examples, which should not limit the scope of the claims herein. As shown in the cross-sectional view, the structure 100 is a tube (FIG. 1A) or structure 100' is a solid circle (FIG. 1B) forming a substrate member in cylindrical form for fabricating solar cell. In three dimensional views, FIG. 1A may be a cylinder or a sphere. In an embodiment, the shape of the substrate should not be a limiting factor, though it may has certain application or manufacture advantages for particular regular shape. Embodiments of the present invention can be applied to other planar or non-planar, or irregular shapes, foils, sheets, tiles, or others. For example, FIG. 1C shows a semi-cylindrical tubular shaped substrate 100A that may be installed as roof tile. FIG. 1D shows a foil or flexible sheet 100B that can be used to make solar cells associated with certain special structures. Each of these substrate members has a surface region 101 that is prepared to form one or more layer or film for fabricating a copper-indium-diselenide thin film solar cell.

Figure 2:
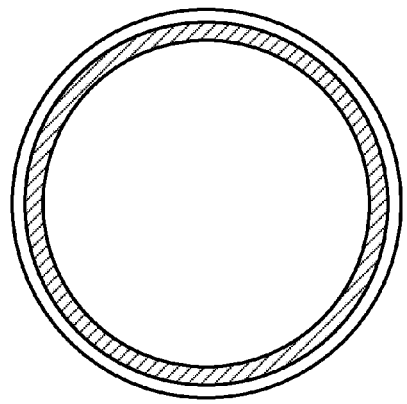
FIG. 2 is a simplified section view of an electrode layer overlying the tubular shaped substrate according to an embodiment of the present invention and FIG. 2A is an enlarged view showing a sectional piece of FIG. 2.
Figure 2A:
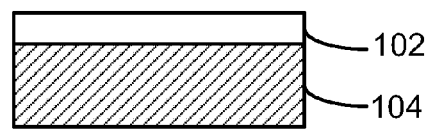

Using cylindrical tubular shaped substrate as an example, the substrate, marked as numerical 104 in FIG. 2A, can be a glass tube, for example, made of a soda lime glass. The cylindrical tube has an OD ranging from 6 mm to 14 mm. However, other types, form factors or materials can also be used. Examples of materials include borosilicate glass, acrylic glass, sugar glass, specialty Corning™ glass, and others. As shown in FIG. 2, an electrical contact layer comprising an electrode layer 102 is formed upon surface of the substrate 104. FIG. 2A, is an enlarged view schematically showing a sectional piece of the electrode layer 102 overlying the substrate 104, for all sort or type of substrate. According to an embodiment, the electrode layer 102 comprises metal material or conductive oxide material that is characterized by a predetermined conductivity that is optimized for thin-film based solar cell applications. Depending on the application, the electrode layer 102 can be formed in various ways. For example, the metal material comprising primarily molybdenum is deposited by sputtering to overly the substrate 104 circumferentially. For example, the thickness of the electrode layer 102 may range form 100 µm to 600 µm. A sputtering apparatus, such as a DC magnetron sputtering apparatus, can be used to deposit metal materials upon a substrate. Such apparatus is well known and commercially available. But it is to be understood that other types of equipments and/or processes, such as evaporation in vacuum based environment may be used as well. For the electrode layer made of conductive oxide material, the film formation process can be according changed to CVD or CBD or other coating processes. Merely as an example, the sputtering deposition process is described below.

Sputter deposition is a physical vapor deposition (PVD) method of depositing thin films by sputtering, or ejecting, material from a "target", or source, which then deposits onto a substrate, such as a silicon wafer or glass. Sputtered atoms ejected from the target have a wide energy distribution, typically up to 10's of eV's (100000 K). The entire range from high-energy ballistic impact to low-energy thermal motion is accessible by changing the background gas pressure. The sputtering gas is often an inert gas such as argon. For efficient momentum transfer, the atomic weight of the sputtering gas should be close to the atomic weight of the target, so for sputtering light elements neon is preferable, while for heavy elements krypton or xenon are used. Reactive gases can also be used to sputter compounds. The compound can be formed on the target surface, in-flight or on the substrate depending on the process parameters. The availability of many parameters that control sputter deposition make it a complex process, but also allow experts a large degree of control over the growth and microstructure of the film.

Figure 3:
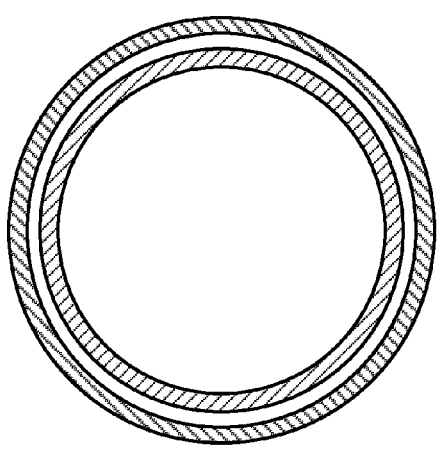
FIG. 3 is a simplified section view of a precursor layer including copper and indium overlying the electrode layer on the cylindrical substrate according to an embodiment of the present invention and FIG. 3A is an enlarged view showing an enlarged sectional piece of FIG. 3.
Figure 3A:
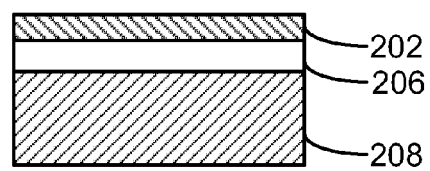

FIG. 3 is a simplified diagram of a precursor layer including copper and indium overlying the electrode layer on the cylindrical substrate according to an embodiment of the present invention and FIG. 3A is an enlarged view showing a sectional piece of FIG. 3. These diagrams are merely examples, which should not limit the scope of the claims herein. In the embodiment, a structure 200 is formed including a substrate 208, preferably soda lime glass in cylindrical tubular shape, which is about 10 millimeters in outside diameter (OD). For example, the glass substrate 208 serves as a supporting material for fabricating a solar cell. The structure 200 includes an electrode layer 206 formed upon the substrate 208. For example, the electrode layer 206 serves as a bottom electrical contact layer for the solar cell. For example, the electrode layer 206 comprises primarily a film of molybdenum or other metal or metal alloy which can be deposited by sputtering to a thickness ranging from 100 to 300 µm.

In a specific embodiment, a barrier layer is first deposited on substrate 208. The barrier layer is provided to insure good adhesion of the overall structure to the substrate 208. In another specific embodiment, the barrier layer also is provided for preventing uncontrolled interdiffusion of sodium atom in the soda lime glass substrate (208) into the metal electrode layer and solar cell material to be formed later on. For example, a film of chromium can be used as the barrier layer. Other types of material may also be used in the barrier layer, such as silicon dioxide, silicon nitride, etc. In another specific embodiment, a well controlled amount of sodium needs to be doped into a precursor film for forming thin-film photovoltaic absorber. In applications of the present invention for making thin-film solar cell using cylindrical, circular, or other curved/flexible shaped substrates, a sodium bearing doping layer can be formed overlying the barrier layer. One method of sodium doping can be accomplished by using sputtering technique from a sodium bearing target. In particular, the sodium doping layer provides a controlled ingredient for forming Cu—Se based thin-film photovoltaic absorber in the up-coming thermal treatment of selenization process. Alternatively, some curved but fixed shaped substrates made by sola lime glasses can be loaded in a specific configuration wherein every substrate is parallel to each other with a gap spacing. In this configuration, the sodium species can be diffused out of one bare soda lime glass and across the gap spacing and served as a doping source of sodium for forming photovoltaic absorber on another substrate disposed at its neighboring position during the selenization process.

Referring to FIG. 3A, a precursor layer 202 including primarily a composite material containing copper species and indium species is formed upon the electrode layer 206. In certain embodiments, a sodium doping layer with a controlled amount is inserted between the precursor layer 202 and the electrode layer 206. In one embodiment, the precursor layer 202 is deposited by a sputtering process. In a specific embodiment, copper or copper-gallium alloy may be deposited first followed by an indium layer overlying the copper layer. In another embodiment, copper (or copper-gallium alloy) and indium can be deposited substantially simultaneously. In still another embodiment, the copper layer overlays the indium layer. But it is to be understood that other deposition arrangements are possible. As an example, a sputtering apparatus, such as a DC magnetron sputtering apparatus, is used to deposit either the precursor layer 202, and/or the electrode layer 206) of materials on a substrate. It is to be appreciated that various types of sputtering apparatus may be used. Such apparatus is well known and commercially available. Other material can also be used. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 2) may be formed in addition to the copper and indium material. According to an embodiment, the ratio between the copper and indium material is less than 1, e.g., 0.92~0.96, or even down to 0.8 or lower; that is, less than one part of copper per one part of indium material.

As an example, the structure 200 is formed by processing the structure 100. For example, the Cu (or Cu—Ga) and In materials are deposited onto the structure 100 to form the structure 200. The Cu—In layer forms a main ingredient of the precursor layer 202 associated with the structure 200 which is used for fabricating a cylindrical shaped CIGS/CIS based solar cell. As described above, sputtering process is used for forming the copper and/or indium layer. It is to be appreciated that techniques described throughout the present application are flexible and that other types of equipments and/or processes, such as evaporation in vacuum based environment may be used as well for depositing copper and indium material. In certain embodiments, gallium material (not shown in FIG. 3) may be formed deposited in addition to the copper and indium material.

In one specific embodiment, the precursor layer 202 mentioned before is formed by sputtering at relative low temperature, for example, less than 200° C. As shown in FIG. 3A, the structure 200 includes a cylindrical tubular shaped substrate 208 covered by electrode layer 206 and followed by the precursor layer 202. In an embodiment, substrate 208 can be made of a glass, for example, a soda lime glass. The electrode layer 206 serves as a back contact. For example, the electrode layer 206 comprises primarily a film of molybdenum material deposited by sputtering. In a specific embodiment, an initial film of chromium can be deposited upon soda lime glass 208 before depositing the molybdenum material to provide as a good adhesion medium of the overall thin film structure to the substrate 208 and as a diffusion barrier preventing sodium ions in glass substrate diffusing into the film in an uncontrolled fashion. After the electrode formation with the molybdenum material, a sodium doping layer can be added using sputtering-in method. In a subsequent selenization process the sodium species can be mixed into the precursor layer in a controlled fashion from the sodium doping layer. The precursor layer 202 comprises primarily a copper indium alloy or copper gallium indium composite material results in an improved homogeneity or advantageous morphology of the composite copper and indium film. In a specific embodiment, this serves as a first stage of solar cell absorber formation process. This improved structure 200 is carried over further into the desired CIS (or CIGS) film after a second stage of the absorber formation process, i.e., a selenization process via a high-temperature annealing treatment. According to an embodiment, the two-stage absorber formation process has many advantages over conventional three-stage or single stage processes in processing control, film quality and production efficiency. For example, the process of forming of CIGS/CIS absorber material with high yield and energy conversion efficiency is facilitated by subjecting the structure 200 (with a precursor layer formed at low temperature) to a high temperature uniform thermal treatment.

Figure 3B:
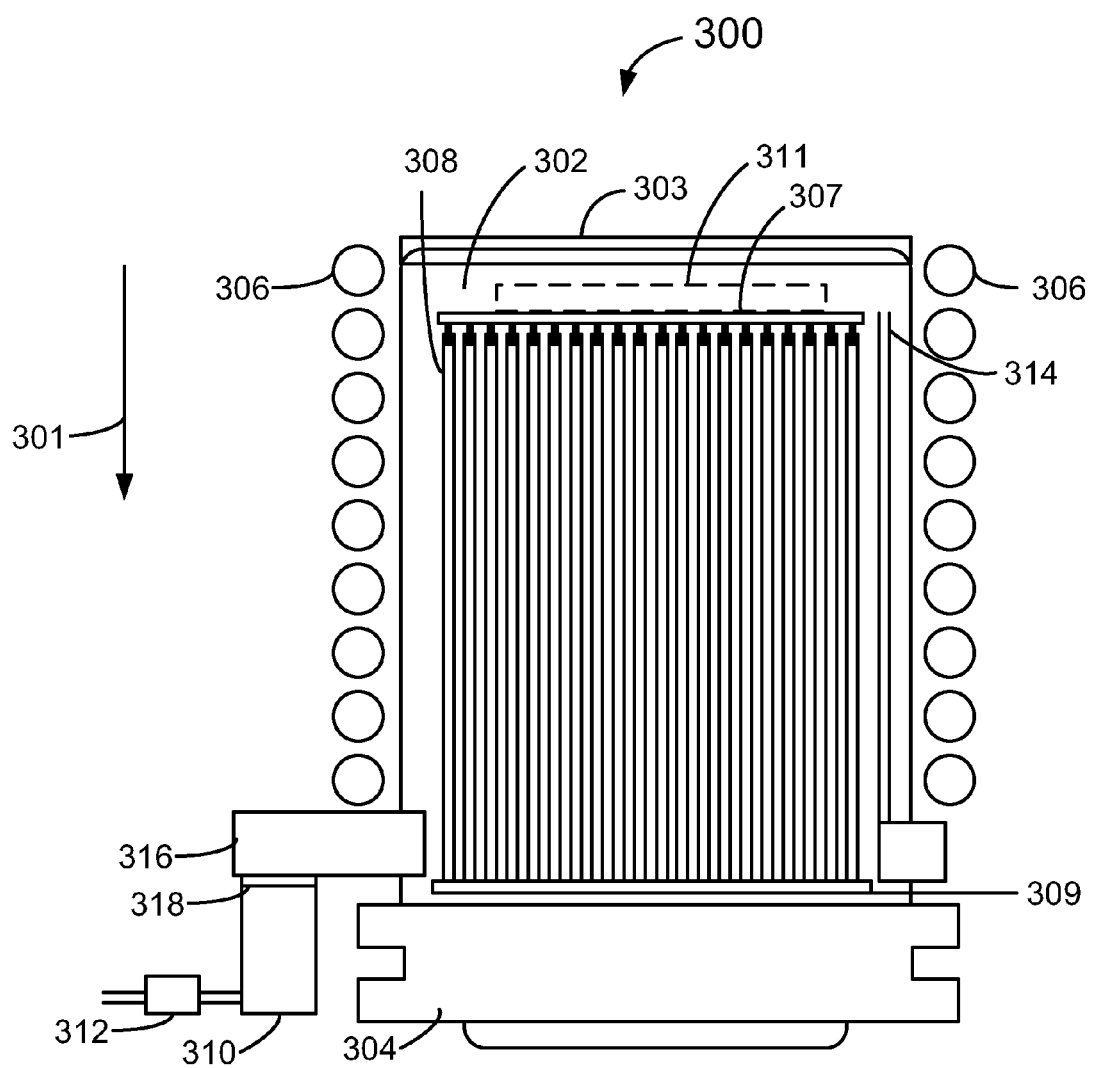
FIG. 3B is a simplified diagram of a furnace for selenization to form CIGS/CIS the thin film according to an embodiment of the present invention.

FIG. 3B is a simplified diagram of a furnace according to an embodiment of the present invention. This diagram is merely an example, which should not limit the scope of the claims herein. As shown, a furnace 300 includes a process chamber 302 with a chamber top cap 303 and an end cap 304. According to an embodiment, the reaction chamber 302 is characterized by a volume of more than 200 liters and the chamber 302 is setup in a vertical orientation with respect to direction of gravity 301. At least in one embodiment, the top cap 303 can be opened to load in the samples or first stage products for the upcoming thermal treatment process. As shown in FIG. 3B, the furnace 300 includes a vacuum-pumping machine that comprises a turbomolecular pump 310 and a rotary pump 312. Depending on the application, the vacuum-pumping machine can be implemented by way of a combination of a mechanical booster pump and a dry pump. For example, the raw material gas and/or a diluting gas such as Helium, Nitrogen, Argon, or Hydrogen can be introduced in process chamber 302 via a gas injection pipe 314, if demanded by the specific applications and/or processes. The chamber 302 is evacuated by the turbomolecular pump 310 via the rotary pump 312 that is connected with a manifold 316 via a gate valve and a conductance valve 318. For example, there are no special partitions in the manifold or in the reaction furnaces. A plurality of heating elements 306 are mounted outside surrounding the reaction chamber 302. Near the end of the thermal treatment process, a temperature ramp-down process is needed. A cooling element 311 is disposed near the top region of the chamber 302 over a top cap 307 of tube holder, which can hold a plurality of tube substrates 308 between the top cap 307 and a bottom cap 309, for providing efficient cooling convection necessary for quick and controllable ramping down process.

The furnace 300 can be used for many applications. According to an embodiment, the furnace 300 is used to apply thermal energy to various types of substrates and to introduce various types of gaseous species, among others. In an embodiment, one or more glass plates are positioned near the center of chamber 302 each in a vertical direction with respect to direction of gravity 301. In another embodiment, one or more cylindrical tube substrates are disposed there in a vertical direction similarly. As an example, each of the tubular substrates 308 can be substantially similar to the structure 200 described in FIGS. 3 and 3A (e.g., a Cu/In precursor layer 202 overlying an electrode layer 206 on a glass tube substrate 208). These tubular substrates 308 are placed in the process chamber 302 in a gaseous environment containing selenium species, such as $H_2Se$ gas (and a carrier gas, such as $N_2$ gas). After annealing the material for a given period of time, the copper, indium and selenium, as well as sodium atoms from sodium doping layer, interdiffuse and react to form a high quality copper indium diselenide (CIS) film or copper indium gallium diselenide (CIGS) film if gallium element added.

Figure 3C:
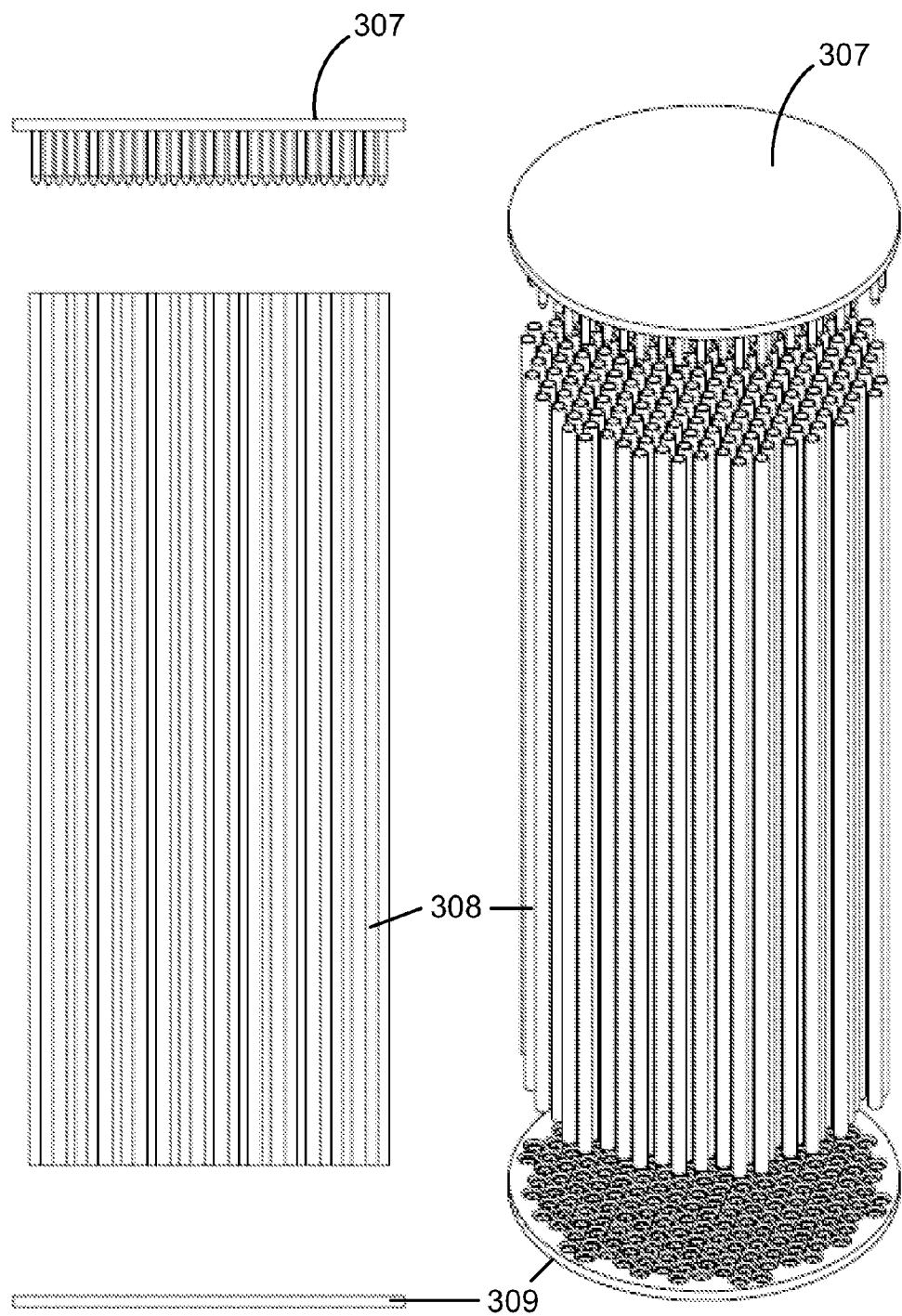
FIGS. 3C and 3D are simplified diagrams showing detail structures of a plurality of tubular cells being held in a capped tube holder within the furnace according to an embodiment of the present invention.
Figure 3D:
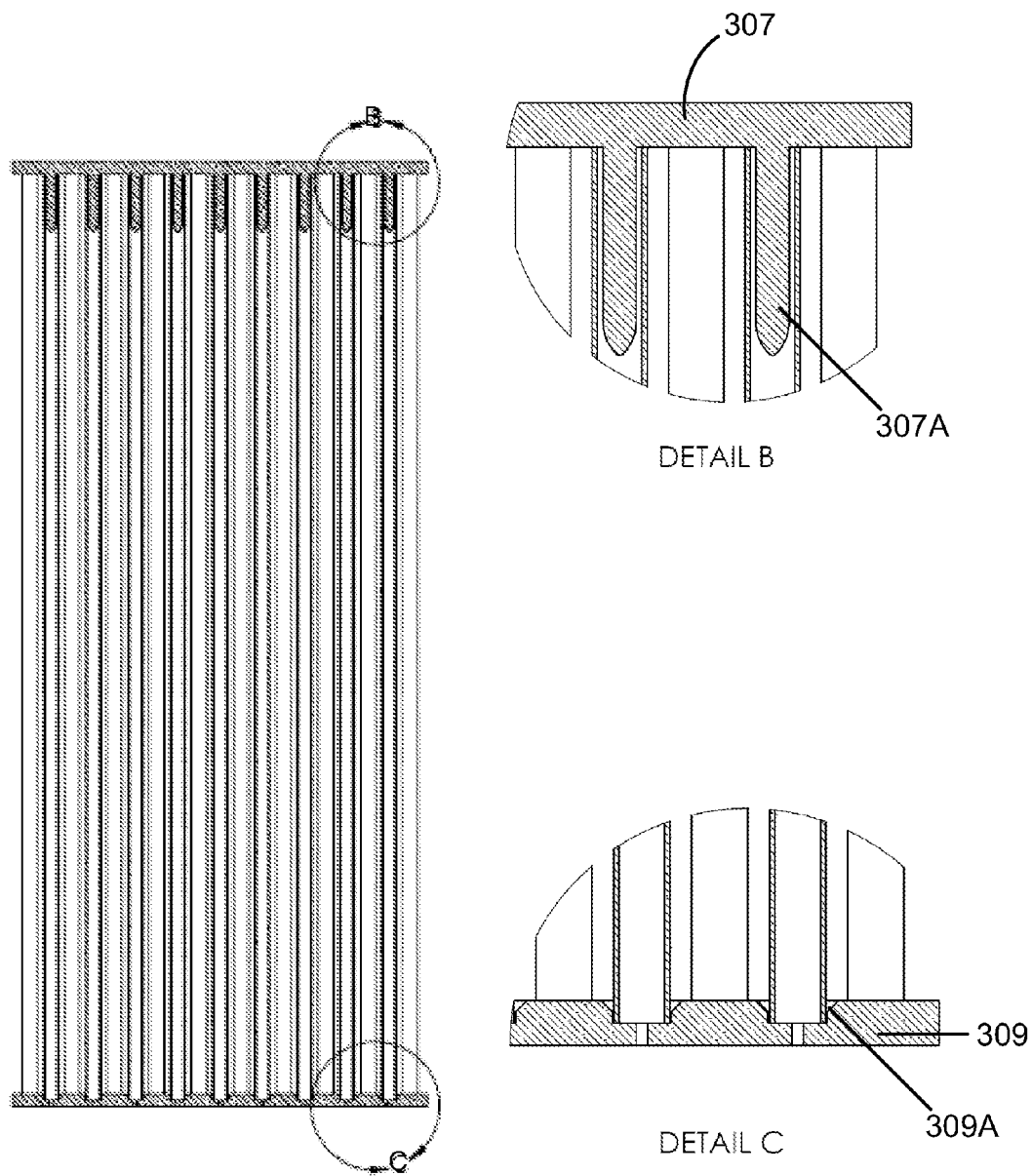

FIGS. 3C and 3D are simplified diagrams showing detail structures of a plurality of tubular substrates being held in a capped tube holder within the furnace according to an embodiment of the present invention. These diagrams are merely examples, which should not limit the scope of the claims herein. One of ordinary skill in the art would recognize many other variations, modifications, and alternatives. As shown in FIG. 3C with both side view and perspective view, a plurality of tubular substrates can be held by this type of holder or support device having two end caps (which are then disposed into the process chamber 304 for performing thermal treatment and selenization process), one at top end of the tubular substrates and one at bottom. A top end cap 307 has a planar top side and a bottom side having multiple protruded pins (307A, shown in Detail B of FIG. 3D). Each pin 307A is positioned and sized properly for inserting one tubular substrate from one end. A bottom end cap 309 of the tube holder has one surface patterned with multiple notches 309A, each being designed to support (with certain restriction) for another end of a tubular substrate, as shown in Detail C of FIG. 3D.

Figure 4:
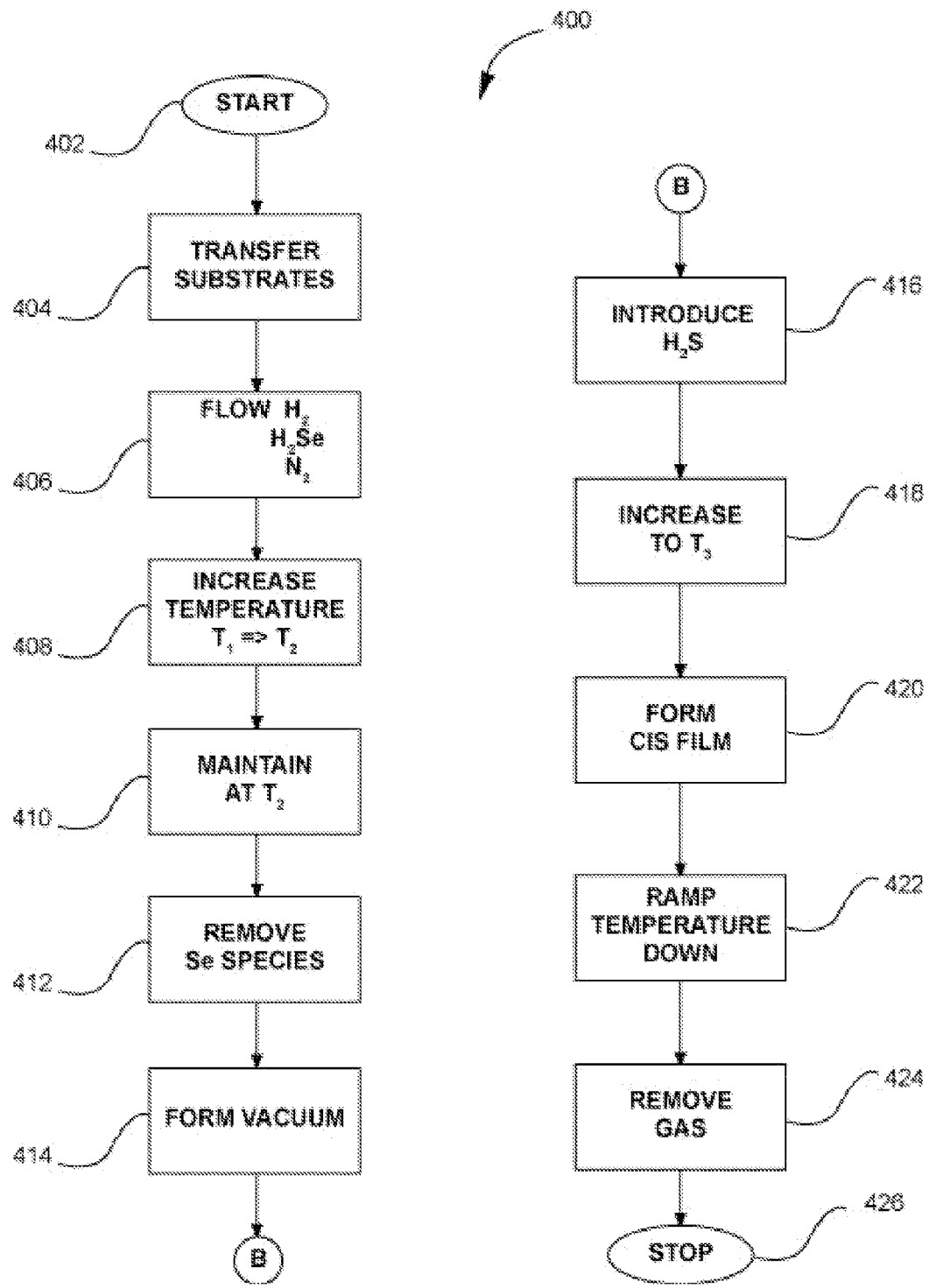
FIG. 4 is a simplified diagram of a method of selenization for forming a copper indium diselenide film according to an embodiment of the present invention.

FIG. 4 is a simplified diagram of a method for selenization in fabricating a CIGS/CIS film for photovoltaic devices according to an embodiment of the present invention. This diagram is merely an example, which should not limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 4, the present method 400 can be briefly outlined by processes below.
 1. Start;
 2. Provide a plurality of substrates having a precursor layer comprising copper and indium;
 3. Introduce a gaseous species including a hydrogen species and a selenium species and a carrier gas into the furnace;
 4. Transfer thermal energy into the furnace to increase a temperature from a first temperature to a second temperature;
 5. Maintain the temperature at about the second temperature for a first period of time;
 6. Remove at least the selenium species from the furnace;
 7. Form vacuum in the process chamber;
 8. Introduce a sulfur species into the furnace;
 9. Increasing the temperature to a third temperature;
 10. Maintain the temperature at about the third temperature for a second period of time;
 11. Ramp down the temperature from the third temperature to about the first temperature;
 12. Remove gas; and
 13. Stop.

These processes are merely examples and should not limit the scope of the claims herein. One of ordinary skill in the art would recognize many other variations, modifications, and alternatives. For example, various processes outlined above may be added, removed, modified, rearranged, repeated, and/or overlapped, as contemplated within the scope of the invention. As shown, the method 400 begins at start, process 402. Here, the user of the method begins at a process chamber, such as the one noted above, as well as others. The process chamber can be maintained at about room temperature before proceeding with the present method.

A plurality of substrates is transferred into the process chamber, process 402. Each of the plurality of substrates can be provided in a vertical orientation with respect to gravity. The plurality of substrates can be defined by a number N, where N is an integer greater than 2. In an embodiment, the plurality of substrates comprises 5 or more individual substrates, each substrate may be substantially the same as the structure 200 in cylindrical shape. In another embodiment, the plurality of substrates comprises 40 or more individual substrates, each substrate having shapes selected from cylinder, sphere, tubular, semi-cylindrical tile, foil, etc. For example, each substrate is a cylindrical rod having an OD ranging from 6 mm to 14 mm. But it is understood that other dimensions are possible. Each of the plurality substrates is maintained by a holder in a configuration substantially free from warp, or stress, or damage. For example, if the substrates were provided in an orientation vertical with respect to gravity so that the gravitational force could not cause the substrates to sag and warp but to help them to be naturally relaxed or stabilized. When the chamber temperature increases, substrate material may reach a glass softening temperature, compromising the structural integrity of the substrate. Typically, glass substrates, particular soda lime glass substrates, begin to soften at 480° C. In an embodiment, the substrates 308 are also separated from one another according to a predetermined spacing to ensure even heating and reactions with gaseous species that are to be introduced to the furnace. For cylindrical rod shaped substrates each with an OD of 10 mm, a typical rod-to-rod spacing should be at least 6 mm when the process chamber is fully loaded.

After the substrates are disposed into the process chamber, gaseous species, including a hydrogen (H) species, a selenium (Se) species, and/or a carrier gas, are introduced into the process chamber in process 406. In an embodiment, the gaseous species includes at least $H_2Se$ gas and a carrier gas. The carrier gas is Nitrogen in an embodiment or other types of chemically inert gas, such as Helium, Argon, etc in certain alternative embodiments. For example, the substrates are placed in the presence of a gas containing Selenium, such as $H_2Se$ gas. In another example, an elemental Selenium gas may be used directly.

The furnace is then heated up to a second temperature ranging from about 350° C. to 450° C. in process 408. The transfer of thermal energy for the purpose of heating the process chamber and the loaded substrates therein can be done by electric heating elements, heating coils, and the like. For example, process 408, among other things, at least starts the formation of a copper indium diselenide film by the thermal induced reactions between the gaseous species and the copper and indium composite (or layered) structure on each of the loaded substrates. In a specific embodiment, separate layers of copper and indium material are diffused into each other to form a single layer of copper indium alloy material. In another specific embodiment, the reaction causes at least a layer of CIGS/CIS formed near the surface of original precursor layer formed on each substrate.

At process 410, the second temperature is maintained for 10 to 60 minutes (a first period of time) at the heat treatment interval between 350 and 450° C. In another embodiment, the second temperature range can be from 390 to 410° C. For example, the period of time for maintaining the temperature at process 410 is provided to allow formation of the CIS film material. As the temperature increases, the pressure inside the furnace may increase as well. In a specific embodiment, a pressure release valve is used to keep the pressure within the furnace at approximately constant at 650 ton.

During the period with the temperature being held (process 410), the removal of the selenium species begins gradually, in process 412. A vacuum environment is formed in the process chamber through a pump, in process 414. Once the vacuum environment is created in the process chamber (process 414), a sulfur species is introduced subsequently, in process 416. In a specific embodiment, the selenium removal process may continue until the process chamber is in a vacuum configuration with the selenium species being 1% or less in volume. After the gas ambience in the furnace has been changed such that the selenium species is removed and the sulfur species is introduced, temperature is ramped up again which is initiated at process 418. In a specific embodiment, the sulfur species is introduced with a carrier gas. The sulfur species can be supplied from hydrogen sulfide gas and the carrier gas can be Nitrogen gas. The temperature of the furnace is increased to a third temperature ranging from about 500° C. to 525° C. For example, the third temperature is calibrated for reaction between the sulfur species and the substrates in furnace.

At process 420, temperature is maintained at the third temperature for a second period of time until the formation of the CIS layers is completed. During the second period of time in the ambience of the furnace the sulfur species is set up to extract out one or more selenium species from the copper indium diselenide film. It is to be appreciated that a predetermined amount of selenium species can be removed. In a specific embodiment, approximately 5% of the selenium species is removed and is replaced by about 5% of sulfur species. According to an embodiment, a complete reaction between the selenium species within the CIS film is desired. After the removal of selenium species, a temperature ramp down process is initiated, in process 422. The furnace is cooled down back to the first temperature of about room temperature, and the remaining gaseous species are removed from the furnace, in process 424. For example, the remaining gaseous species are removed by a vacuum pumping system. The temperature changing sequence described above can be illustrated in a temperature profile shown in FIG. 5.

After process 420, additional steps may be performed depending on the desired end product. For example, if a CIS or CIGS type of thin-film solar cell is desired, additional processes are provided to provide additional structures, such as a transparent oxide layer such as ZnO overlaying the CIS film.

It is also understood that the examples and embodiments described herein are for illustrative purposes only and that various modifications or changes in light thereof will be suggest to persons skilled in the art and are to be included within the spirit and purview of this application and scope of the appended claims.

Figure 5:
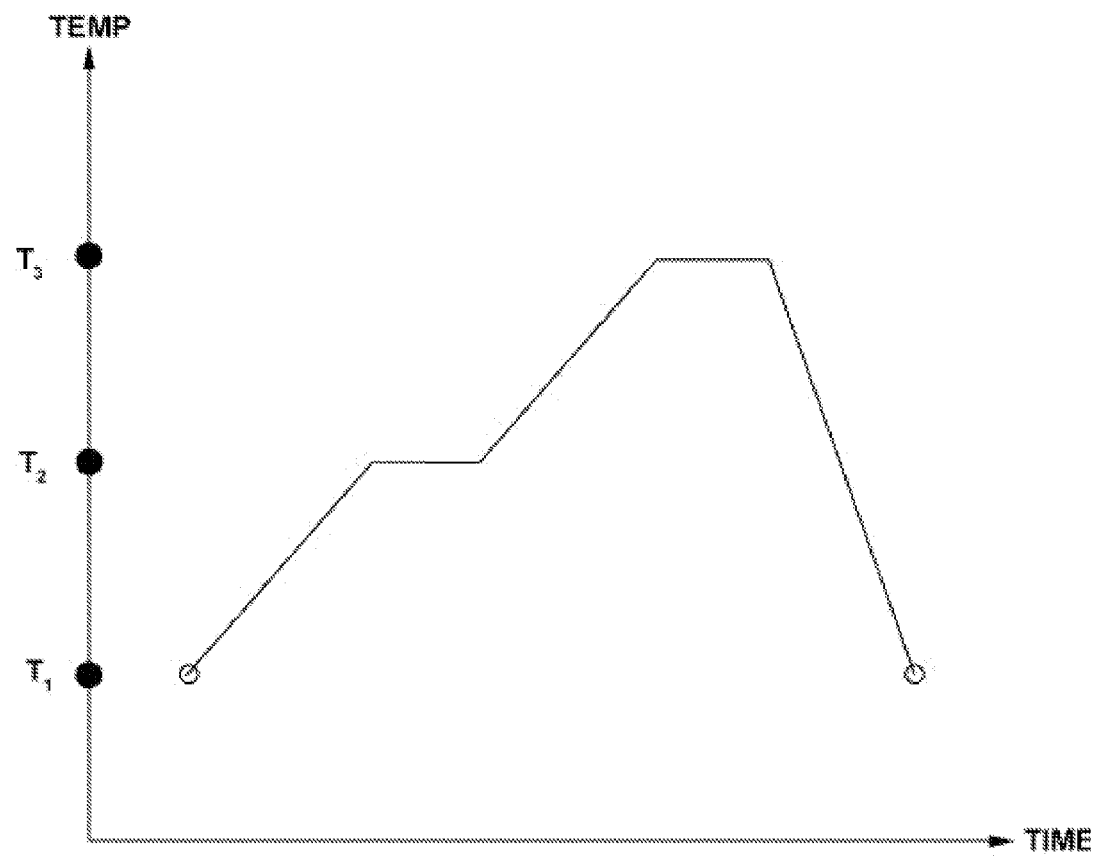
FIGS. 5 and 5A are simplified diagrams of a temperature profile of the furnace according to an embodiment of the present invention.

FIG. 5 is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5) is provided to illustrate a heating process according to an embodiment of the present invention. The optimized profile regulates the process chamber in order to keep substrate at substantially uniform temperature and prevent the warping of large/long substrates at high temperatures. If the temperature is ramped up too high too quickly, stress-induced warping or damage may occur due to the softening of glass. In addition, the total amount of thermal energy is determined in consideration of total thermal budget available to the substrates and to maintain the uniformity and structure integrity of the glass substrate. For example, by periodically controlling the temperature of the heating process in steps, the substrate stays at a pseudo-thermal equilibrium state with minimized thermal stress in which the requisite film/structure integrity is maintained. As explained above, material such as glass tends to deform at a temperature of 480 degrees Celsius or higher, and thus caution is exercised to avoid prolong exposure of the glass substrate at high temperatures.

Referring to FIG. 5, while the ambience of the process chamber is maintained with a gaseous species including a hydrogen species and a selenium species plus a carrier gas, a plurality of substrates is put into the furnace. The plurality of substrates is provided in a vertical orientation with respect to a direction of gravity, with the plurality of substrates numbered from 2 to N, where the N is an integer greater than 5, or greater than 10, or greater than 40. The plurality of substrates numbered from 2 to N in the furnace are substantially the same each having a form selected from a cylinder, a sphere, a tubular, a non-planar, and a foil and comprising the precursor layer overlying the electrode layer. In a specific embodiment, the plurality of substrates are loaded in a configuration that they are substantially parallel to each other with a certain spatial gap in between. In an embodiment, the substrates include glass substrates, such as soda lime glass. The furnace is at a first temperature of about 30° C. (i.e., room temperature). The furnace is then heated up to a second temperature ranging from about 350° C. to 450° C.

The second temperature is maintained for 10 to 60 minutes (the first period of time) at the heat treatment interval between 350° C. to 450° C. Due to large/long size of the glass substrate, a is the warping/twisting/bending or other thermal-induced damages of the glass substrate at high temperatures. If the temperature is ramped up directly to T3, those damages may occur. As shown, the slope of ramping up from T2 to T3 is calibrated to reduce and/or eliminate the risk of thermal damaging the substrate. By maintaining the temperature in the process chamber at T2 for a period of time, the thermal state of the substrate can be sufficiently relaxed and stabilized. The time interval is programmed according to the purpose of at least initiating a formation of the copper indium diselenide film from the copper and indium composite structure on each of the substrates while reducing non-desired damaging.

While the second temperature is maintained, the ambience of the furnace is changed such that the selenium species is removed and a sulfur species is introduced (in a specific embodiment H$_2$S gas is supplied).

After the gas ambience in the furnace has been changed such that the selenium species is removed and the sulfur species is introduced, a second temperature ramp up process is initiated. In this process, the temperature of the furnace is increased to a third temperature ranging from about 500° C. to 525° C.

After the second temperature ramp-up process, the temperature of the furnace is maintained at the third temperature for 10 to 40 minutes (the second period of time) at the heat treatment interval between 500° C. and 525° C. The maintaining time at this interval in the ambience of the furnace comprising the sulfur species (for example hydrogen sulfide gas) is set up according to the purpose of extracting out one or more selenium species from the copper indium diselenide film formed earlier. As explained above, a predetermined amount (e.g., 5 to 10%) of selenium species is extracted to provide a proper amount of selenium concentration within the CIS film.

After the removal of selenium species, a temperature ramp-down process is initiated, as the furnace is then cooled to the first temperature of about room temperature. According to an embodiment, the cooling process is specifically calibrated. As a result of this process, the copper, indium, and selenium atoms, as well as sodium atoms, interdiffuse and react to form a high quality copper indium diselenide film.

Figure 5A:
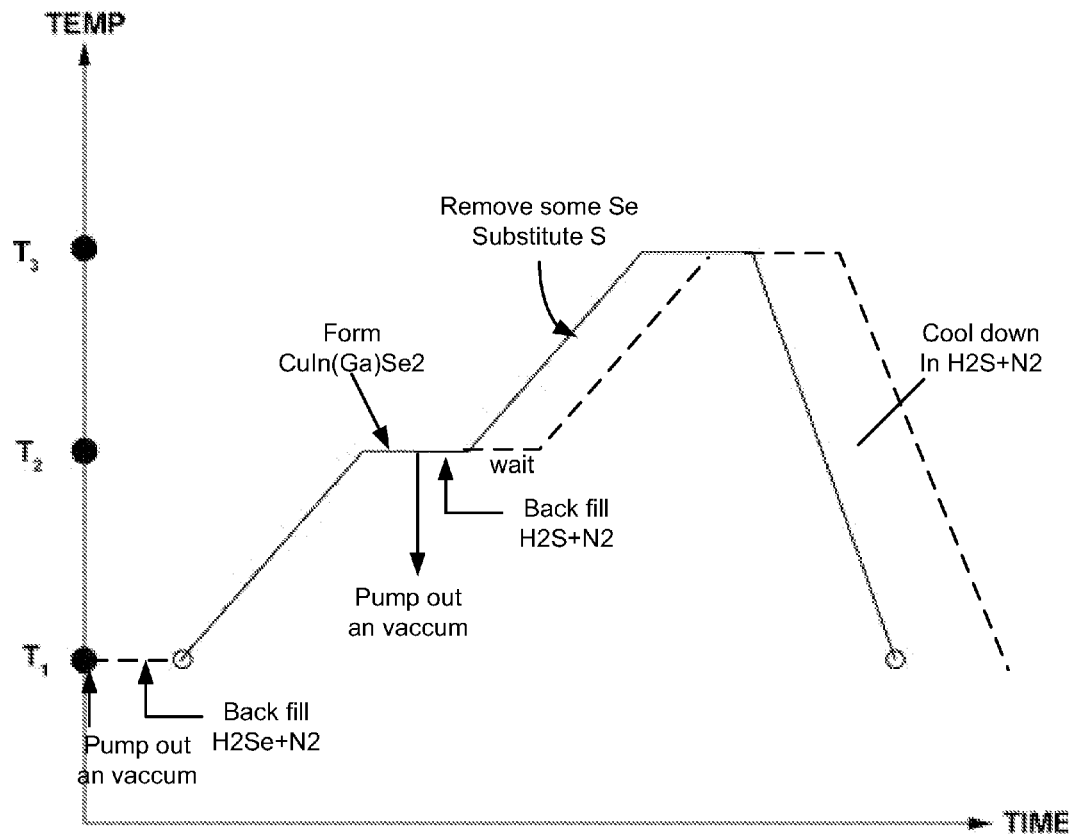

FIG. 5A is a simplified diagram of a temperature profile of the furnace according to an embodiment of the present invention. This diagram is merely an example, which should not limit the scope of the claims herein. The temperature profile further details the temperature ramping process in the above-described method outline (FIG. 4) and specification. An optimized temperature profile (FIG. 5A) is provided to illustrate a heating process according to an embodiment of the present invention.

As shown in FIG. 5A, T1 is approximately at room temperature. At this temperature, substrates are loaded into a furnace. Air is pumped out (e.g., by vacuum device) from the furnace, and a gaseous selenium species (for example, H$_2$Se gas) and N$_2$ gas species are introduced into the furnace. For example, these gas species are introduced to the furnace until the chamber pressure reaches to approximate 650 Torr.

Next temperature increases from T1 to T2 inside the furnace. For example, the rate of temperature ramping up is optimized to allow the relative uniform reaction between selenium and copper and indium (and possibly with addition of gallium). According to embodiments, the T2 temperature is approximately between 350° C. and 450° C. For example, the furnace stays at the T2 temperature for about 10 to 60 minutes. The time staying at the T2 temperature is to allow for reaction between selenium and copper indium material and mixing of sodium species with the precursor layer. In a specific embodiment, separate layers of copper and indium material form copper indium alloy while reacting with selenium species in gas phase. As shown, CIS and/or CIGS material is formed at T2. During the temperature ramping up process, the pressure inside the furnace is controlled to sustain a relative uniform pressure level of approximate 650 torr. For example, a gas escape valve is used to release gases when the furnace heats up, where pressure increases due to gas expansion at high temperature.

After the CIGS/CIS film is formed, various gaseous species are again pumped out from the furnace. Then, H$_2$S gas along with one more inert gases (e.g., nitrogen, argon, helium, etc.) are introduced to the furnace, and the temperature inside the furnace increases from T2 to T3. For example, T3 is approximately 500 to 550 degrees Celsius. In a specific embodiment, the temperature stays at T3 to allow the H$_2$S to interact with the CIGS/CIS material. For example, the sulfur species replaces approximately 3 to 10% of the selenium species in the CIGS and/or CIS material. After the reaction, remaining H$_2$S gas is removed from the furnace and the furnace cools down.

Figure 6A:
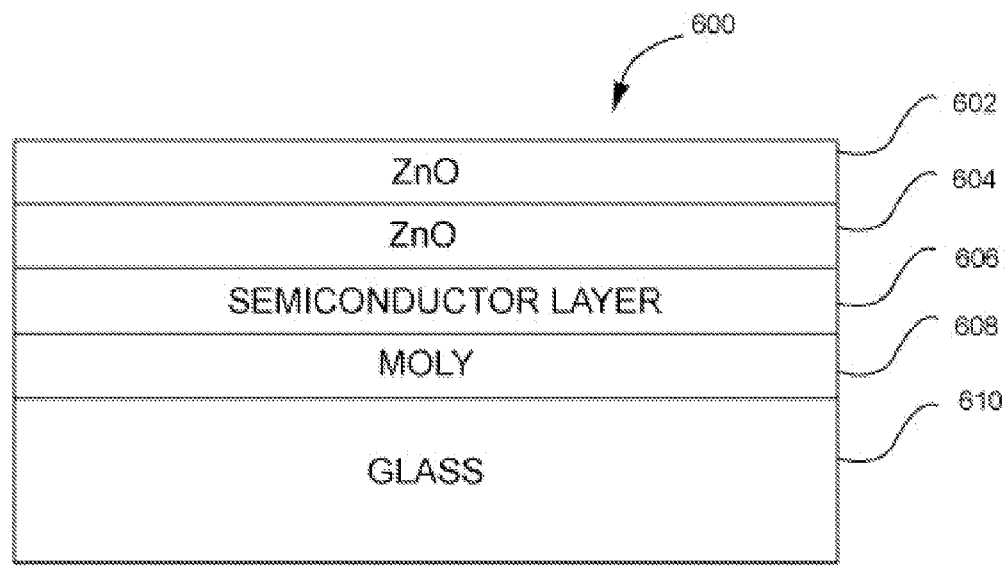
FIGS. 6A and 6B are simplified sectional views of thin film copper indium diselenide solar cell according to an embodiment of the present invention.
Figure 6B:
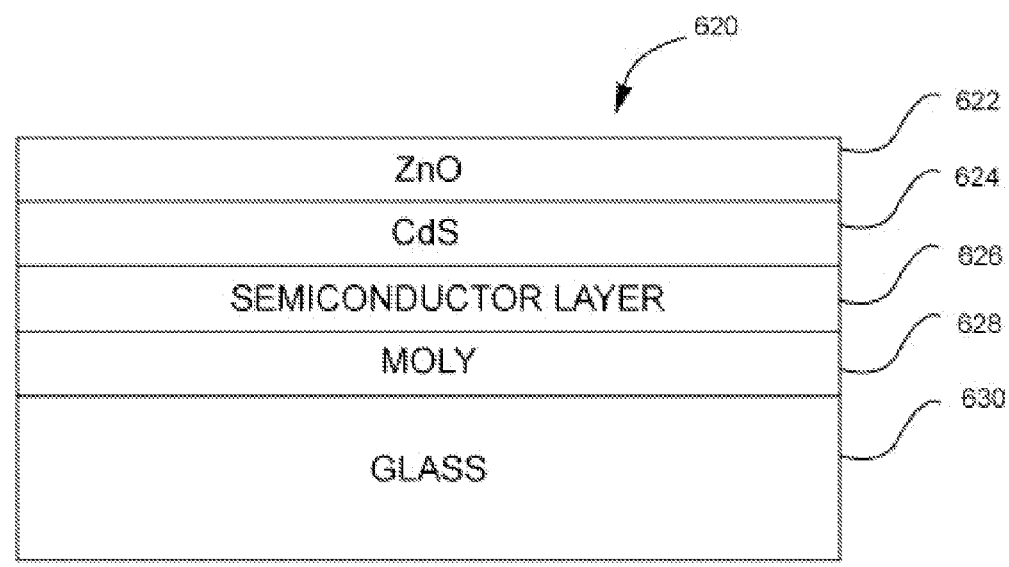

FIG. 6A or 6B is a simplified diagram of a sectional thin film copper indium diselenide device according to an embodiment of the present invention. This diagram is merely an example, which should not limit the scope of the claims herein. As shown, structure 600 is supported on a glass substrate 610. According to an embodiment, the glass substrate comprises soda lime glass. FIG. 6A or 6B merely shows a part of a CIS device in a form of a cylindrical rod or a tube or a foil or other non-planar shape. A back contact including a metal layer 608 is deposited upon substrate 610. According to an embodiment, layer 608 comprises primarily a film of molybdenum which can be deposited by sputtering or other PVD techniques. The first active region of the structure 600 comprises a semiconductor layer 606. In an embodiment, the semiconductor layer includes p-type copper indium deselenide (CIS) material. It is to be understood that other the semiconductor layer may include other types of material, such as CIGS, as shown, which functions as an absorber layer of the solar cells. The second active portion of the structure 600 comprises layers 604 and 602 of n-type semiconductor material, such as CdS or ZnO. For example, in solar cell applications, the CdS and/or ZnO layers function as a winder layer of the solar cells. In FIG. 6B, ZnO is shown overlaying the CdS layer. However, it should be understood that other variations are possible. In an alternative embodiments, the ZnO layer 602 overlays another ZnO layer that is characterized by a different resistivity.

A photovoltaic cell, or solar cell, such as device 600 described above, is configured as a large-area p-n junction. When photons in sunlight hit the photovoltaic cell, the photons may be reflected, pass through the transparent electrode layer, or become absorbed. The semiconductor layer absorbs the energy causing electron-hole pairs to be created. A photon needs to have greater energy than that of the band gap in order to excite an electron from the valence band into the conduction band. This allows the electrons to flow through the material to produce a current. The complementary positive charges, or holes, flow in the direction opposite of the electrons in a photovoltaic cell. A solar panel having many photovoltaic cells can convert solar energy into direct current electricity.

Semiconductors based on the copper indium diselenide (CIS) configuration are especially attractive for thin film solar cell application because of their high optical absorption coefficients and versatile optical and electrical characteristics. These characteristics can in principle be manipulated and tuned for a specific need in a given device. Selenium allows for better uniformity across the layer and so the number of recombination sites in the film are reduced which benefits the quantum efficiency and thus the conversion efficiency.

The present invention provides methods for making CIS-based and/or CIGS-based solar cells on various planar or non-planar shaped glass substrate including cylindrical, tubular, spherical, semi-cylindrical, foil, or other regular/irregular shapes. The device structure described in FIGS. 6A and 6B can be patterned into individual solar cells on the glass substrate and interconnected to form a large scale PV system for power generating. The present invention provides a cost-effective method for making thin film solar cell/system. The flexibility in substrate shape selection certainly provides many advantages in many applications and huge cost-saving in production.

It will be appreciated that all of the benefits of the present invention can be achieved regardless of the order of deposition of the copper and indium films. That is, the indium could be deposited first or the films could be deposited as a sandwich or stack of thinner layers.

It is also understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. No. 4,611,091 and U.S. Pat. No. 4,612,411, hereby incorporated by reference herein, without departing from the invention described by the claims herein.

What is claimed is:

1. A method for selenization in fabricating a copper indium diselenide semiconductor film comprising:
   providing a substrate member, the substrate member characterized by a surface region;
   forming a first electrode layer overlying the surface region of the substrate member;
   sputtering a sodium doping layer;
   depositing a precursor layer which includes at least one of copper, indium, and gallium over the sodium doping layer;
   placing the substrate in a vertically oriented annular chamber;
   introducing a gaseous species including at least a selenium gas species and a carrier gas into the annular chamber;
   transferring thermal energy into the annular chamber to increase its temperature to a first temperature between about 350° C. to about 450° C. to at least initiate a formation of a copper indium diselenide film from the precursor layer;
   maintaining the temperature for a first period of time;
   suspending introduction of at least the selenium gas species from the annular chamber during the first period of time;
   introducing a sulfur species into the annular chamber during the first period of time;
   increasing the temperature at the end of the first period of time from the first temperature to a second temperature between about 500° C. to about 525° C. while the substrate member is maintained in an environment including the sulfur species to thereby substitute between about 3% and 10% atomically of the selenium gas species from the copper indium diselenide film with the sulfur species.

2. The method of claim 1 wherein the substrate member comprises glass, soda-lime glass, acrylic glass, sugar glass, Corning™ glass, or plastic.

3. The method of claim 1 further comprising forming a barrier layer comprising a film of at least one of chromium, silicon dioxide, and silicon nitride prior to forming the first electrode layer.

4. The method of claim 1 wherein the copper indium diselenide film comprises a film having a copper-to-indium ratio between about 0.8 and 1.0.

5. The method of claim 4 wherein the amount of selenium substituted is about 5%.

6. The method of claim 1 wherein the step depositing the precursor layer comprises sputtering copper, indium, or gallium species at a temperature below 200° C.

7. The method of claim 1 wherein depositing the precursor layer comprises evaporating at least one of copper, indium and gallium containing species at a temperature below 200° C.

8. The method of claim 1 further comprising maintaining a substantially constant pressure level within the chamber of about 600 to 700 torr.

9. The method of claim 1 wherein the carrier gas comprises an inert gas at about 5 to 10% concentration by volume.

10. The method of claim 1 wherein the step of maintaining the temperature is carried out for a time about 60 minutes or less.

11. The method of claim 1 wherein the selenium species is extracted from the chamber and the sulfur species is introduced with nitrogen gas.

12. The method of claim 1 wherein the first temperature ranges from about 390° C. to about 410° C.

13. The method of claim 1 wherein the chamber is maintained at about room temperature prior to being heated.

14. The method of claim 1 wherein the first period of time is about 10 to 60 minutes.

15. The method of claim 1 wherein the gaseous species comprises at least one of H2Se gas or elemental selenium gas.

16. The method of claim 1 further comprising transferring a plurality of substantially identically shaped substrates into the annular chamber.

17. The method of claim 16 wherein each of the plurality of substrates is separated by a predetermined distance and loaded in a vertical orientation.

18. The method of claim 16 wherein the annular chamber is further characterized by a temperature uniformity of plus or minus 10% throughout the furnace.

19. The method of claim 16 wherein each of the plurality of substrates is held by a capped holder.

20. The method of claim 1 further comprising maintaining the sulfur species to a concentration ranging from about 10 to about 25% by volume of total gas within the annular chamber.

21. The method of claim 11 wherein the selenium gas species is substantially removed from the annular chamber before introducing the sulfur species.

22. The method of claim 1 wherein the temperature of about 500° C. to about 525° C. is maintained for about 10 to 40 minutes, and then reduced.

23. The method of claim 1 followed by the steps of forming a n-type window layer over the film and then forming a second electrode layer over the n-type window layer.

* * * * *